United States Patent [19]
Pham et al.

[11] Patent Number: 5,835,421
[45] Date of Patent: Nov. 10, 1998

[54] METHOD AND APPARATUS FOR REDUCING FAILURES DUE TO BIT LINE COUPLING AND REDUCING POWER CONSUMPTION IN A MEMORY

[75] Inventors: Luat Q. Pham, Houston; Francisco A. Cano, Missouri City, both of Tex.

[73] Assignee: Texas Instruments Incorporated, Dallas, Tex.

[21] Appl. No.: 747,119

[22] Filed: Nov. 8, 1996

Related U.S. Application Data

[60] Provisional application No. 60/006,664, Nov. 13, 1995.

[51] Int. Cl.$^6$ .................................................. G11C 7/00

[52] U.S. Cl. ................... 365/189.02; 365/203; 365/227

[58] Field of Search ............................... 365/189.02, 204, 365/227, 206, 200, 203, 230.02

[56] References Cited

U.S. PATENT DOCUMENTS

| | | | |
|---|---|---|---|
| 4,417,326 | 11/1983 | Toyoda et al. | 365/204 |
| 4,667,311 | 5/1987 | Ul Haq et al. | 365/190 |
| 5,062,079 | 10/1991 | Tsuchida et al. | 365/203 |
| 5,099,452 | 3/1992 | Yamakoshi et al. | 365/206 |
| 5,398,207 | 3/1995 | Tsuchida et al. | 365/204 |
| 5,453,955 | 9/1995 | Sakui et al. | 365/203 |
| 5,526,319 | 6/1996 | Dennard et al. | 365/205 |

*Primary Examiner*—Tan T. Nguyen
*Attorney, Agent, or Firm*—Robert D. Marshall, Jr.; James C. Kesterson; Richard L. Donaldson

[57] ABSTRACT

A method and apparatus for reducing failures due to bit line coupling and reducing power consumption in a memory (10). The method comprises precharging a first group of bitlines (22) to a first voltage level. Other bit lines (22) are maintained at a second voltage level. After data has been read from the memory (10), the first group of bit lines (22) is discharged to the second voltage level.

23 Claims, 4 Drawing Sheets

METHOD AND APPARATUS FOR REDUCING FAILURES DUE TO BIT LINE COUPLING AND REDUCING POWER CONSUMPTION IN A MEMORY

This application claims priority under 35 USC 119(e)(1) of the provisional application number 60/006,664Nov. 13, 1995.

CROSS-REFERENCE TO RELATED APPLICATIONS

This application is related to U.S. application Ser. No. 08/745,399, Attorney's Docket No. TI-18299, filed on Nov. 8, 1996 by Luat Q. Pham and Francisco A. Cano and entitled "Method and Appratus for Self-Timed Precharge of Bit Lines in a Memory."

TECHNICAL FIELD OF THE INVENTION

This invention relates generally to memories and more particularly to a method and apparatus for reducing failures due to bit line coupling and reducing power consumption.

BACKGROUND OF THE INVENTION

Memory devices such as read-only memories ordinarily comprise an array of memory cells. Each column in the array is connected by a bit line and each row in the array is connected by a word line. Data is read by placing electrical signals on the appropriate word lines and bit lines.

For example, in a read-only memory (ROM) where the memory cells comprise NMOS transistors, the bit lines are precharged to a high voltage. Then, the appropriate word line is activated. After the word line is activated, if the memory cell connected to that word line and a precharged bit line has been programmed to be a logic low value, the bit line will remain at a high voltage. (The logic value representation is arbitrary and could be defined opposite to this definition.) If, however, that memory cell has been programmed to be a logic high value, then activation of the word line will discharge the precharged bit line through the memory cell, causing the bit line to have a low voltage level.

One recurring problem in memory design is capacitive coupling between adjacent bit lines as well as power consumption due to pre-charging of bit lines. Coupling occurs due to capacitance between adjacent bit lines. Excess power is consumed when bit lines are precharged, but not used during a memory cycle.

Many existing read-only memory designs pre-charge all bit lines in a memory array, even those that will not be accessed during a particular memory cycle. Besides unnecessarily consuming the power it takes to precharge unused bit lines, precharging all of the lines can increase the coupling between adjacent bit lines. To solve this problem, engineers can take steps during the circuit layout of a ROM to reduce the coupling between adjacent bit lines.

Still, these methods do not solve the problem of power consumption. Also, in a compiler ROM environment, it is undesirable to have to redesign the layout of the bit lines with each new design. In a compiler ROM environment, a: single ROM design is used by a semiconductor manufacturer in many different application-specific integrated circuits (ASICs) which may include ROMs with different sized arrays, different multiplexer ratios, and different fabrication technologies. The advantages of being able to use the same compiler ROM design for a host of applications are significantly reduced if the layout must be re-engineered each time to reduce bit line coupling.

Memory designers have attempted to reduce power consumption by precharging only the bit lines being used during a particular memory cycle. The method previously employed for reducing power consumption is to associate a precharge circuit with each bit line at the top of the memory array. Decoders turn on only the precharge circuits associated with bit lines that will be accessed during a particular memory cycle.

Unfortunately, this architecture has several disadvantages. First, it is hard to scale in the compiler ROM environment where there are variable multiplexer ratios. Second, a precharge circuit is needed for each bit line. Third, the bit line coupling problem is not eliminated and becomes even more difficult to detect. Bit line coupling is still a problem because the bit lines that are used during a particular memory cycle are not discharged at the end of the memory cycle. Accordingly, when a bit line is used during a memory cycle, charge may remain on that bit line during subsequent memory cycles when it is not used. Under the right conditions, errors can result from bit line coupling caused by this remaining charge. Even worse, bit line coupling failures may be code-dependent because the coupling phenomenon depends upon both the order in which the bit lines are accessed and what binary value appears on these bit lines during a series of memory cycles.

SUMMARY OF THE INVENTION

The present invention reduces and virtually eliminates failures due to bit line coupling and reduces power consumption in a read-only memory. In accordance with one aspect of the invention, only those bit lines that are to be accessed during a particular memory cycle are preset to a first voltage level. The bit lines that are not accessed during that memory cycle are maintained at a second voltage level. After the data has been read from the memory, those bit lines that were accessed during that memory cycle are restored to the second voltage level. For example, in a ROM employing NMOS transistors as memory cells, those bit lines that are to be accessed during a particular memory cycle are preset to a high voltage at the beginning of the memory cycle while the remaining bit lines are held at ground. After the data has been read from the memory, those bit lines that were precharged high are discharged to ground.

The invention has several important technical advantages. The invention conserves power by only precharging bit lines that are actually used during a particular memory cycle. The bit line coupling problem is significantly reduced by discharging all bit lines used during a memory cycle at the conclusion of that memory cycle. The invention allows a designer of an ASIC to easily determine the power consumption of the ROM as power consumption is fairly constant. The invention reduces or eliminates the need to take steps during layout of the memory to reduce bit line coupling. This advantage makes the invention particularly well suited to a compiler ROM environment where one ROM design is used for a number of semiconductor technologies, ROM sizes, and ROM multiplexer ratios. The invention also allows precharging of the bit lines through the column multiplexer. This feature allows one precharge circuit to be used for multiple bit lines. This architecture allows easy scaling in the compiler ROM environment where variable multiplexer ratios are encountered.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1–6 of the drawings, like numerals being used for like and corresponding parts of the various drawings.

Figure 1:
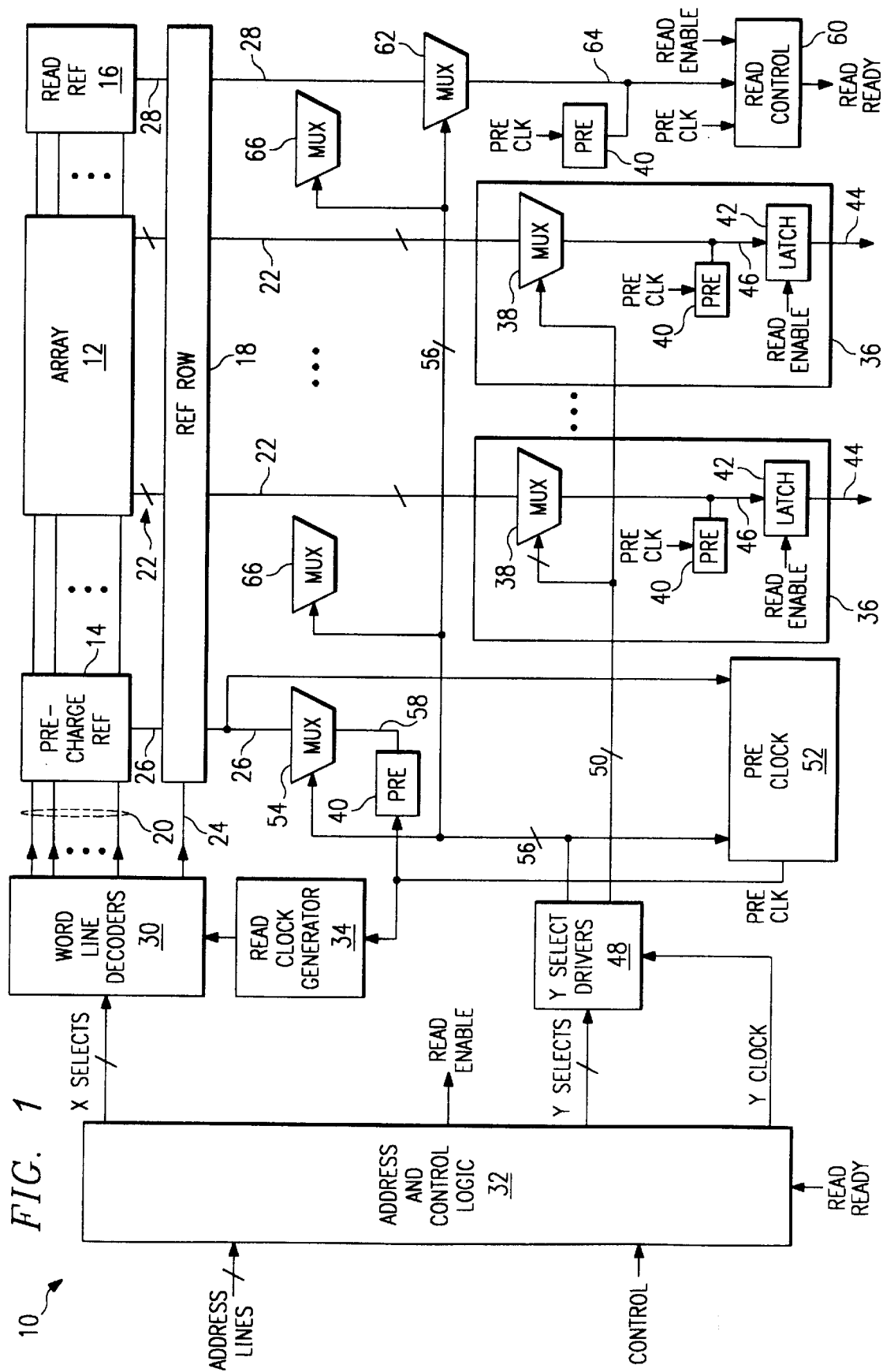
FIG. 1 illustrates a block diagram of a read-only memory constructed in accordance with the teachings of the present invention.

FIG. 1 illustrates a ROM 10 constructed in accordance with the teachings of the present invention. ROM 10 comprises an array of memory cells 12. Array 12 comprises an N by M array of memory cells. In addition to the memory cells in array 12, ROM 10 further comprises two additional columns and one additional row of memory cells.

Precharge reference column 14 and read reference column 16 comprise the additional columns of memory cells while reference row 18 comprises the additional row of memory cells. Except as discussed below, precharge reference column 14 and read reference column 16 are each programmed such that they behave with the worst possible speed with respect to memory array 12. In other words, the rise time and fall time of signals on precharge reference column 14 and read reference column 16 is designed to be a worst case rise time and/or fall time. Similarly, the reference row 18 represents the worst case propagation for a word line.

Each row of memory cells in array 12 is connected by a word line 20. Each memory cell in reference row 18 is connected by reference word line 24. Each memory cell in a column of array 12 is connected to a bit line 22. The memory cells in precharge reference column 14 are connected to read reference bit line 26. The memory cells in read reference column 16 are connected to read reference bit line 28.

ROM 10 further comprises word line decoders 30 and address and control logic 32. Based upon the address signals received by ROM 10, address and control logic 32 generates a plurality of X-select signals that are provided to word line decoders 30. Word line decoders 30 enable one of the word lines 20 during a particular memory cycle based upon the condition of the X-select signals. Word line decoders 30 also enable reference word line 24 at the proper time during each memory cycle as reference word line 24 is used for timing as discussed below. Word line decoders 30 receive a read clock signal from read clock generator 34 to indicate the proper time at which to enable one of the word lines 20 and reference word line 24.

ROM 10 further comprises a plurality of bit slices 36. Each bit slice 36 comprises multiplexer 38, precharge circuit 40 and latch 42. Each bit slice 36 is connected to one or more bit lines 22. Ordinarily, the width of array 12 is much greater than the actual number of bits that need to be read during any particular memory cycle. Multiple bit lines 22 are multiplexed onto a single data output 44. In this example, multiplexer 38 multiplexes four bit lines onto each intermediate line 46. Intermediate line 46 serves as an input to latch 42. As will be discussed below, each multiplexer 38 comprises a plurality of column multiplexer circuits. Each bit line 22 connects to one of these column multiplexer circuits. The operation of these column multiplexer circuits is discussed in connection with FIGS. 3 and 5 below.

Also described more fully in connection with FIGS. 3 and 5 below, one unique aspect of the present invention is the method of precharging bit lines 22. In this example, a single precharge circuit 40 is associated with each bit slice 36. Precharge circuit 40 is connected to multiplexer 38 through intermediate line 46 and precharges one of the bit lines 22 connected to the corresponding multiplexer 38. Multiplexer 38 passes the signal from precharge circuit 40 to only one of the bit lines 22 connected to multiplexer 38.

Latch 42 latches the output data value at the end of a memory cycle. The value latched from intermediate line 46 then appears on data output 44.

ROM 10 further comprises Y-select drivers 48. Address and control logic 32 generates Y-select signals based upon the value of the address signals received by ROM 10. Y-select drivers 48 generate true and complement forms of the Y-select signals under control of the Y-clock signal received from address and control logic 32. Y-select drivers 48 in turn generate true and complement forms of data Y-select signals which are sent to multiplexers 38 through data Y-select signal lines 50. Each multiplexer 38 receives both true and complement forms of the Y-select signals contained on data Y-select signal lines 50.

ROM 10 further comprises precharge clock circuit 52 and precharge reference column multiplexer circuit 54. Precharge clock circuit 52 generates the precharge clock signal; this signal controls when the precharge circuits 40 are enabled and disabled. In addition, the precharge clock signal is also sent to read clock generator 34 to indicate when word line decoders 30 should be enabled. Based upon the state of the precharge clock signal, read clock generator 34, which is connected to word line decoders 30, generates a signal indicating when the word lines should be enabled and disabled. As inputs, precharge clock circuit 52 receives the signal on precharge reference bit line 26 and the reference Y-select signals on reference Y-select lines 56, which are generated by Y-select drivers 48.

Precharge reference column multiplexer circuit 54 is of the type described below in connection with FIG. 5. Precharge reference column multiplexer circuit 54 is connected to reference Y-select lines 56, precharge reference bit line 26 and intermediate line 58. At the beginning of a memory cycle, precharge reference column multiplexer circuit 54 acts as a passgate connecting precharge circuit 40 to precharge reference bit line 26, thus allowing precharge circuit 40 to precharge the precharge reference bit line 26. Precharge reference column multiplexer circuit 54 acts as a passgate only when selected by the reference Y-select signals on reference Y-select lines 56. At the end of a memory cycle, precharge reference column multiplexer circuit 54 discharges precharge reference bit line 26, restoring it to a voltage near ground. At this point, intermediate line 58 is precharged to a high voltage.

ROM 10 further comprises read control circuit 60 and read reference column multiplexer circuit 62. Read control circuit 60 connects to read reference column multiplexer circuit 62 through intermediate line 64. Read reference column multiplexer 62 is connected to read reference bit line 28 and is controlled by reference Y-select signals on reference Y-select lines 56.

Read control circuit 60 generates a read ready signal indicating that the data on bit lines 22 is ready to be latched into the latches 42. The read ready signal is sent to address and control logic 32, that then generates a read enable signal in response to the read ready signal. The read enable signal is sent to each of the latches 42, that latch in the value of the signal on their corresponding intermediate line 46 in response to the read enable signal. Read control circuit 60 generates the read ready signal in response to the precharge clock signal, read enable signal, and the value of the signal on intermediate line 64.

The operation of read reference column multiplexer circuit 62 with respect to read reference bit line 28 is similar to that of precharge reference column multiplexer circuit 54 with respect to precharge reference bit line 26. During the first portion of a memory cycle, read reference column multiplexer circuit 62 acts as a passgate connecting precharge circuit 40 to read reference bit line 28, thus allowing precharging of read reference bit line 28. Precharge circuit 40 is connected through intermediate line 64 to read reference bit line 28 by read reference column multiplexer circuit 62 in response to reference Y-select signals appearing on reference Y-select lines 56. After read reference bit line 28 has been precharged, read reference column multiplexer circuit 62 passes the value of read reference bit line 28 to intermediate line 64. At the end of a memory cycle, read reference column multiplexer circuit 62 discharges read reference bit line 28 to a voltage level near ground.

ROM 10 further comprises a plurality of reference multiplexers 66. In this embodiment, there is one reference multiplexer 66 for each bit slice 36. Reference multiplexers 66 are used to create a capacitive load on reference Y-select lines 56 to replicate the propagation delay of the Y-select signals on data Y-select signal lines 50. By matching the capacitive load, the proper timing relationship is maintained between the data Y-select signal lines 50 and the reference Y-select lines 56.

Precharge clock circuit 52 determines when the bit lines 22 have been properly precharged by monitoring precharge reference bit line 26. Similarly, read control circuit 60 determines the validity of data on bit lines 22 by monitoring the state of read reference bit line 28. In both cases, these circuits sense when the voltage on the corresponding reference bit line has passed a voltage trip point. This trip point should preferably be chosen to match the trip point of the latches 42. In addition, to assure proper timing, the topology and device size ratios for precharge clock circuit 52 and read control circuit 60 are nearly identical to the topology and device size ratios of latch 42.

Figure 2:
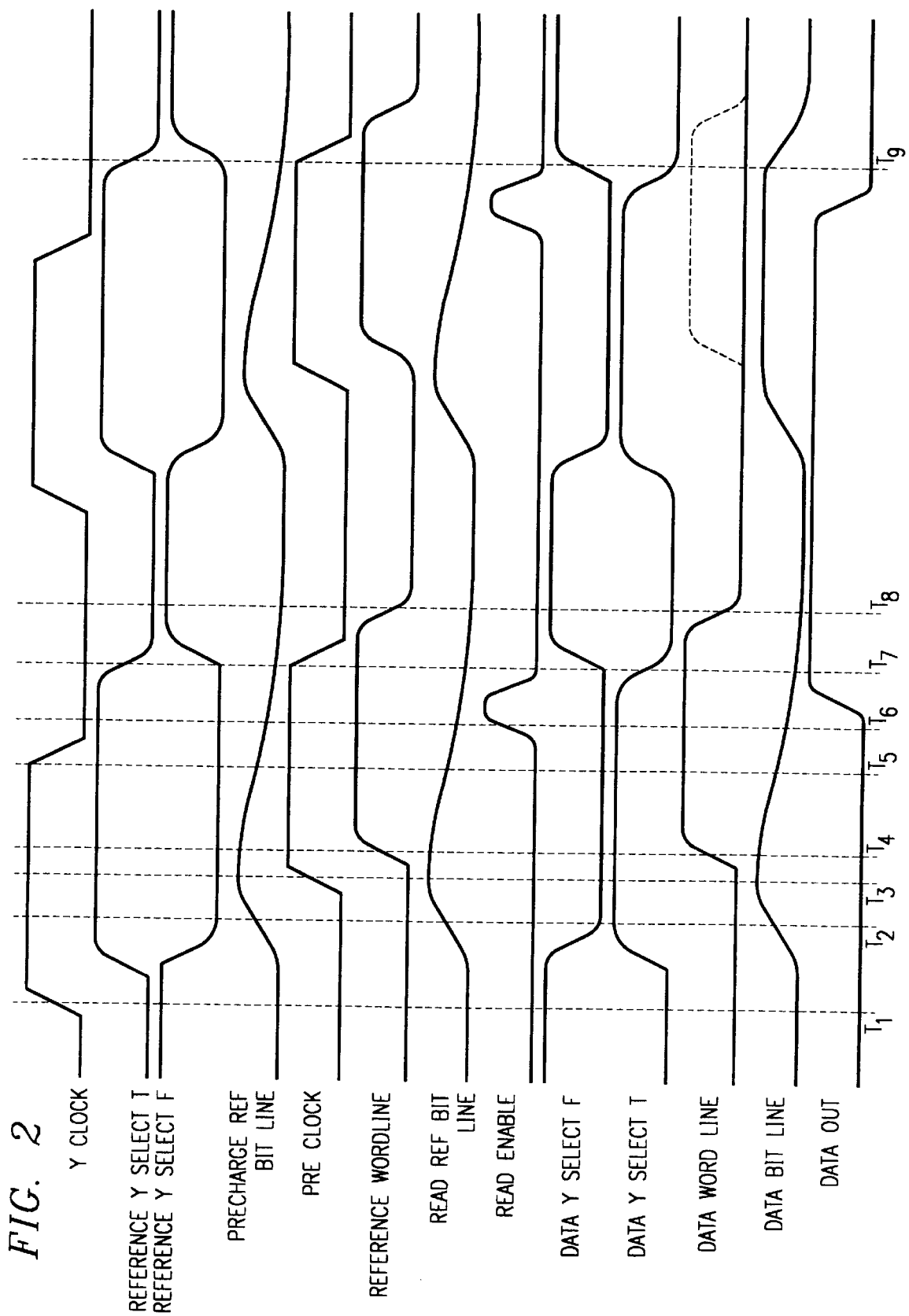
FIG. 2 illustrates a timing diagram showing the operation of the ROM of FIG. 1.

FIG. 2 illustrates a timing diagram for two memory cycles of ROM 10. The operation of ROM 10 can best be understood by referring to the timing diagram of FIG. 2 while also referring to the block diagram of ROM 10 in FIG. 1.

At the beginning of a memory cycle, the precharge circuits 40 are enabled as indicated by the low state of the precharge clock on the timing diagram. The precharge clock signal is an active low signal in this embodiment. When a request arrives to read data, address and control logic 32 decodes the address and at time T1, generates a rising edge on the Y-clock signal. This rising edge indicates that the Y-select signals from address and control logic 32 are valid. Next, Y-select drivers 48 generate both the reference Y-select and data Y-select signals. Both true and complement values for each of these signals is provided. In the timing diagram illustrated in FIG. 2, these signals are represented by "reference Y-select T" and "reference Y-select F" for the reference Y-select signals and "data Y-select F" and "data Y-select T" for the data Y-select signals. The rising or the "reference Y-select true" signal and falling of the "reference Y-select false" signal causes multiplexer 38 to connect one of its corresponding bit lines 22 to its intermediate line 46. That bit line 22 is connected to intermediate line 46 in a passgate fashion and because precharge circuit 40 is already enabled by the low level of the precharge clock signal, the bit lines 22 begin to precharge.

Similarly, precharge reference bit line 26 and read reference bit line 28 also begin to precharge as they are connected to their corresponding precharge circuits 40 through their corresponding intermediate lines 58 and 64 by precharge reference column multiplexer circuit 54 and read reference column multiplexer circuit 62, respectively. Precharge reference column multiplexer circuit 54 and read reference column multiplexer circuit 62 connect intermediate lines 58 and 64, respectively, to precharge reference bit line 26 and read reference bit line 28 in response to the "reference Y-select T" signal going high and the "reference Y-select F" signal going low.

The self timed precharge function of the invention is then performed by precharge clock circuit 52. Precharge clock circuit 52 monitors the status of precharge reference bit line 26. As can be seen in the timing diagram of FIG. 2, precharge reference bit line 26 charges slowly due to the capacitive load on it. As discussed above, precharge reference bit line 26 is designed to have a worst case rise time when compared to the other bit lines 22 of the array 12. (As discussed below, however, this delay can be optimized.) Thus, as soon as precharge reference bit line 26 has passed beyond a predetermined threshold, the other bit lines 22 will be logically precharged beyond the threshold of the latch. As illustrated in FIG. 2, after the voltage on precharge reference bit line 26 has passed the threshold at time T2, all of the data bit lines 22 are logically precharged beyond the threshold of the latch. Once precharge clock circuit 52 senses that precharge reference bit line 26 has exceeded the predetermined voltage threshold, it causes the precharge clock signal to go high at time T3, thus turning off each of the precharge circuits 40.

Thus, the invention self times the precharge of bit lines 22 using a reference bit line programmed to have a worst case delay. For applications where speed is critical, precharge reference column 14 can be programmed to cause precharge reference bit line 26 to reach its threshold faster. This is accomplished in an array of N rows by connecting less than N memory cells to precharge reference bit line 26. Connecting less memory cells lowers the capacitance and increases the speed of precharge reference bit line 26.

There are several applications where programming may be advantageous. First, where an array 12 with a small number of rows is employed, the propagation delay through precharge clock circuit 52 may be sufficient to allow each of the bit lines 22 to be logically precharged beyond the threshold of the latch. Also, a computer can process the code programmed into ROM 10 to determine the maximum number of ones and zeros in each column of array 12. Based upon this maximum number, the precharge reference column 14 can be programmed for a worst case delay that matches the delay of the slowest column in array 12. This feature allows easy optimization of the self timed precharge feature without time consuming redesign of the precharge timing circuitry.

Continuing with the operation of ROM 10, after the precharge clock signal rises at time T3, read clock generator 34 generates a read clock signal for word line decoders 30, causing the appropriate data word line and the reference word line to rise at time T4. At time T4, the data word line and reference word line are now active. Once the word lines 20 are active, those bit lines 22 having a memory cell associated with the active word line that has been programmed to be a logic high value (transistor connected) begin to discharge towards ground. Those bit lines 22 with a memory cell associated with the active word line that has been programmed to be a logic low value (no transistor connected) remain at a high voltage. (The choice of a transistor connected indicating a logic high value and no transistor connected indicating a logic low value is arbitrary and could be reversed.)

The last memory cell in the reference row 18 connects to read reference bit line 28 and is programmed as a logic high value (transistor connected). Thus, once the reference word line 24 is active, read reference bit line 28 begins to discharge.

Read reference bit line 28 is also programmed to have a worst case delay when compared to each of the bit lines 22. As can be seen in FIG. 2, its capacitive load gives it a longer rise time and fall time when compared to the remaining bit lines 22. Once read reference bit line 28 has fallen below a predetermined voltage threshold, those bit lines 22 that are discharging towards ground will have also discharged below this threshold such that the data values on bit lines 22 are valid and can be latched into the latches 42 and output onto data outputs 44. Thus, ROM 10 also employs self-timing to determine when the data can be read from bit lines 22. Again, where speed is critical, read reference column 16 can be programmed similarly to the way precharge reference column 14 can be programmed to optimize performance.

Continuing with the operation of ROM 10, at time T5, read reference bit line 28 falls below the voltage threshold indicating that the data on bit lines 22 is now valid. Read control circuit 60, after sensing this transition, generates a read ready signal which is processed by address and control logic 32. Address and control logic 32 generates the read enable signal. At time T6, the rising of the read enable signal causes the data on each intermediate line 46 to be latched into the latches 42 and appears on data outputs 44. As the read enable signal falls, the reference Y-select and data Y-select signals change state at time T7.

After the reference Y-select and data Y-select signals have changed state, the bit lines 22 are isolated from intermediate lines 46. In addition, the multiplexers 38 connect the bit lines 22 that were precharged during the memory cycle to ground, causing a discharge of each of the corresponding bit lines 22. In accordance with this aspect of the invention, failures due to coupling between adjacent bit lines are virtually eliminated. Similarly, the precharge reference bit line 26 is isolated from intermediate line 58 and the read reference bit line 28 is isolated from intermediate line 64. Precharge reference column multiplexer circuit 54 and read reference column multiplexer circuit 62 discharge both the precharge reference bit line 26 and read reference bit line 28, respectively.

Next, the precharge clock returns to a low state, enabling the precharge circuits 40 for the next cycle. Finally, at time T8, the reference word lines return to a low value.

The second cycle of ROM 10 illustrated in FIG. 2 shows how a data bit line operates when the memory cell at the activated word line is programmed to be a logic low value (no transistor connected). As can be seen in FIG. 2, the value of the data bit line remains high and does not discharge throughout most of the memory cycle. The correct logic low value is latched into data latch 42 and appears on the data output 44. At time T9, when the reference Y-select false signal returns to a high value, the multiplexer 38 causes the data bit line 22 to discharge to ground. Again, this feature of the invention virtually eliminates failures due to bit line coupling between adjacent bit lines.

ROM 10 also employs a novel method and apparatus for reducing failures due to bit line coupling and power consumption in ROM 10. Bit line coupling and power consumption is reduced by precharging bit lines through multiplexer 38 and discharging each precharged bit line at the end of a memory cycle. Also, bit lines 22 that are not precharged during a particular memory cycle are held at ground, rather than being allowed to float. This aspect of the invention can best be understood by referring to FIG. 3.

Figure 3:
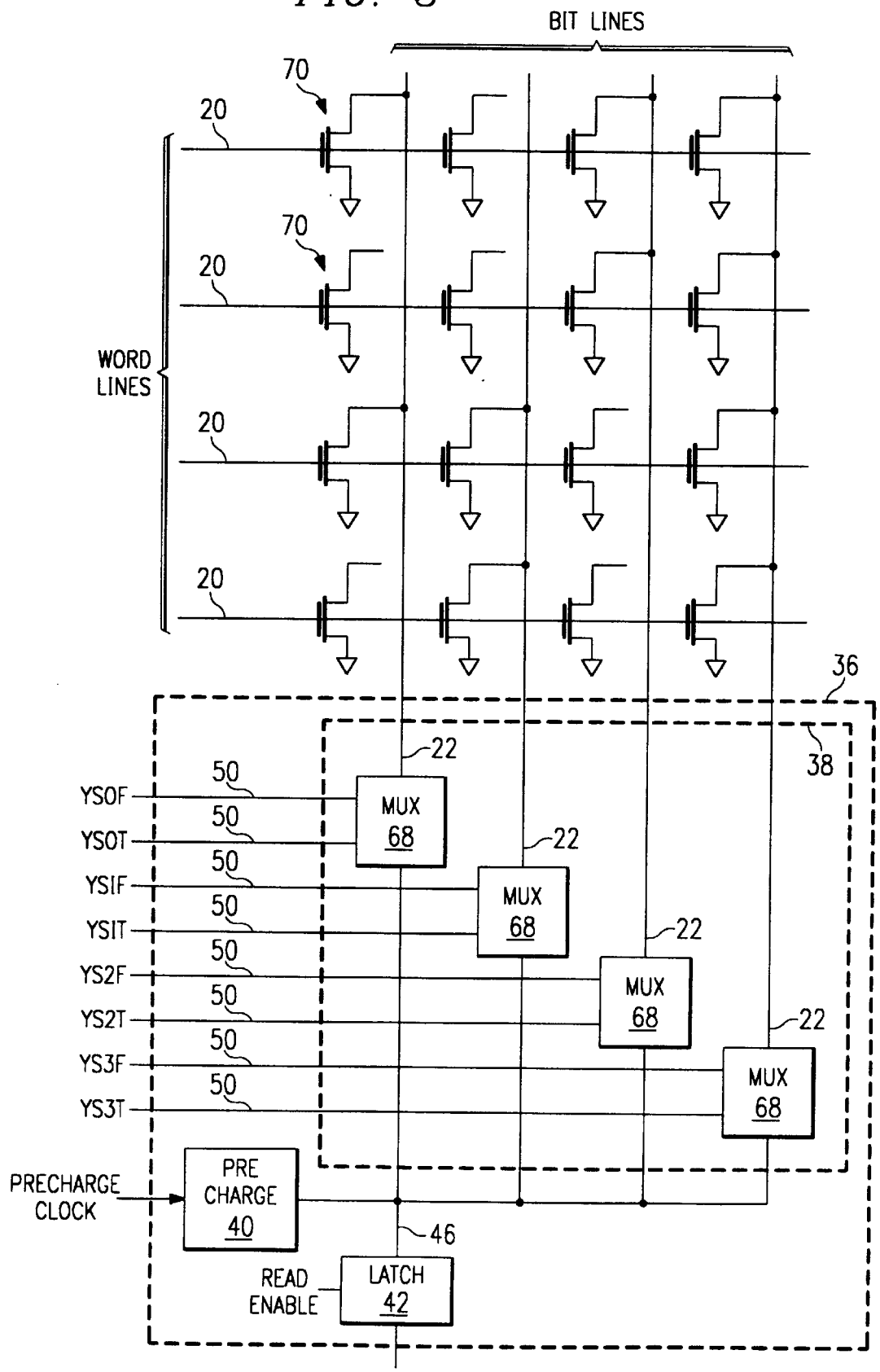
FIG. 3 illustrates how the bit lines in the ROM of FIG. 1 can be precharged through a multiplexer in accordance with the invention.

FIG. 3 illustrates a portion of ROM 10 constructed in accordance with the invention. In this example, ROM 10 has four rows, and thus four word lines 20. It also has a multiplexer ratio of four to one and, therefore, four bit lines 22 per bit slice 36. In this example, multiplexer 38 is a four to one multiplexer. Referring to FIG. 3, multiplexer 38 comprises four column multiplexer circuits 68, one for each bit line 22. These column multiplexer circuits 68 are of the type illustrated in FIG. 5 and are similar to precharge reference column multiplexer circuit 54 and read reference column multiplexer circuit 62 illustrated in FIG. 1. Each of the 16 memory cells in FIG. 3 comprise an NMOS transistor 70. Those NMOS transistors 70 that are connected to a bit line 22 indicate a memory cell with a logic high value while those that are not connected indicate a memory cell with a logic low value. Each word line connects to a row of memory cells (four for each bit slice) and each bit line 22 connects to a column of four memory cells.

Each column multiplexer circuit 68 connects to a bit line 22 and intermediate line 46. Each of the column multiplexer circuits 68 is controlled by both the true and complement forms of a Y-select signal appearing on one of the data Y-select signal lines 50.

The invention reduces failures due to bit line coupling in two ways. First, unselected bit lines 22 are grounded by their corresponding column multiplexer circuit 68 during an entire memory cycle in which they are not selected. Any signal appearing on an unselected bit line 22 is thus discharged to ground. Second, when a bit line 22 has been precharged, and was thus active during a memory cycle, column multiplexer circuit 68 discharges that bit line 22 to ground when the column multiplexer circuit 68 is deselected at the end of the memory cycle. Accordingly, no charge remains on any of the bit lines 22 at the end of a memory cycle.

Each column multiplexer circuit 68 operates as follows. When the corresponding data Y-select true signal is high, column multiplexer circuit 68 connects the corresponding bit line 22 to the corresponding intermediate line 46, allowing the bit line 22 to be charged by precharge circuit 40. Near the end of a memory cycle, this connection allows bit line 22 to be read and its valued latched into latch 42. When the corresponding data Y-select true signal is low,the precharge clock also is low, and the output of the column multiplexer circuit 68 connected to intermediate line 46 is precharged high and the bit line 22 is held low.

The invention saves power by precharging only those bit lines that will be read during a particular memory cycle. In addition, the invention employs only one precharge circuit 40 for each bit slice 36, thus allowing precharge circuitry 40 to be shared among several bit lines 22. Power consumption in this architecture is fairly constant. The invention avoids the need to take steps during the layout of ROM 10 to reduce bit line coupling because failures due to bit line coupling are virtually eliminated by tying unused bit lines 22 to ground and discharging used bit lines to ground at the end of a memory cycle. The invention may be advantageously employed in a compiler ROM application where the multiplexer ratio is unknown.

An alternative embodiment to that illustrated in FIG. 3 could employ a precharge circuit 40 for each bit line 22. In such an embodiment, the precharge circuit 40 would be located at the top of array 12 and each precharge circuit 40 would be controlled by a decoder. In such an embodiment, precharge circuitry 40 could be modified to incorporate the invention's methods of reducing failures due to bit line coupling. Precharge circuitry 40 could be modified such that a bit line that was not used during a particular memory cycle would be held at ground while a bit line 22 that was used during that memory cycle would be discharged to ground at the conclusion of the memory cycle.

Figure 4:
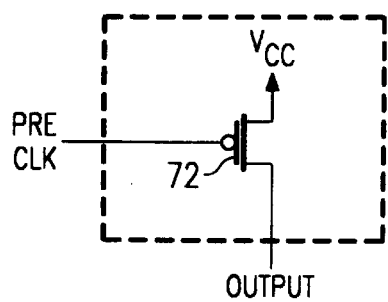
FIG. 4 illustrates one embodiment of a precharge circuit that can be used in the ROM of FIG. 1.

FIG. 4 illustrates a particular embodiment of precharge circuit 40 that can be used with the present invention. In this embodiment, precharge circuit 40 comprises PMOS transistor 72. In operation, when the precharge clock signal is high, the output of precharge circuit 40 floats. When the precharge clock signal is low, PMOS transistor 72 conducts and causes its output to rise to $V_{cc}$.

Figure 5:
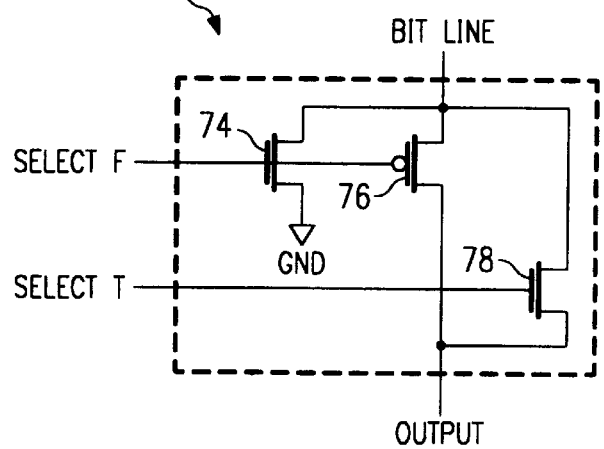
FIG. 5 illustrates one embodiment of a column multiplexer that can be used in the ROM of FIG. 1.

FIG. 5 illustrates an embodiment of a column multiplexer circuit 68 that can be used with the invention. Column multiplexer circuit 68 can also be used for precharge reference column multiplexer circuit 54 and read reference column multiplexer 62 of FIG. 1. Column multiplexer circuit 68 comprises NMOS transistor 74, PMOS transistor 76 and NMOS transistor 78. The "multiplexer-select true" input line connects to the gate of NMOS transistor 78 while the "multiplexer-select false" (complement) input line connects to the gate of NMOS transistor 74 and PMOS transistor 76.

When the "multiplexer-select true" signal is high, the "multiplexer-select false" signal will be low, thus connecting the bit line to the output. The relationship between PMOS transistor 76 and NMOS transistor 78 allows this connection to be bi-directional, thus allowing the precharge circuit to precharge the bit line through the output of column multiplexer circuit 68 during a portion of the memory cycle and allowing the value of the bit lines to appear on the output of the column multiplexer circuit 68 for capture by one of the latches 42 at the conclusion of the memory cycle. At the conclusion of the memory cycle, the "multiplexer-select true" input has a low value and the "multiplexer-select false" input has a high value, thus causing the bit line to be grounded through NMOS transistor 74. Similarly, when a bit line is not used during a particular memory cycle, the "multiplexer-select false" input will remain high while the "multiplexer-select true" input will remain low, thus grounding the bit line through NMOS transistor 74 for the entire memory cycle.

Figure 6:
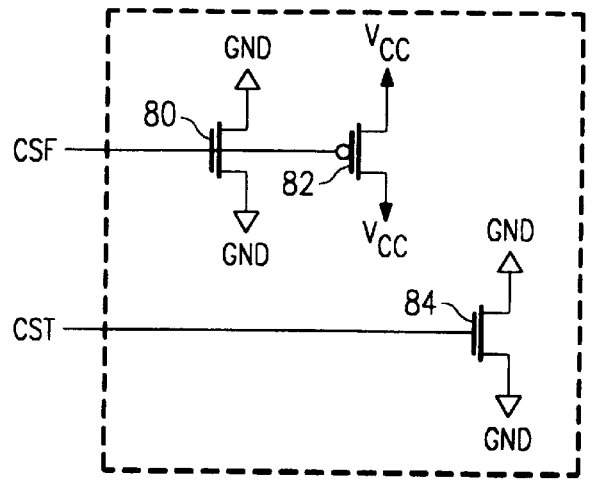
FIG. 6 illustrates a reference multiplexer that can be used in the ROM of FIG. 1.

FIG. 6 illustrates an embodiment of a reference multiplexer 66 that can be used with the ROM 10 of FIG. 1. Reference multiplexer 66 is designed to replicate the capacitive load created by the column multiplexer circuits 68 so as to replicate the propagation delay of signals on the data Y-select signal lines 50. Reference multiplexer 66 comprises an NMOS transistor 80, PMOS transistor 82 and NMOS transistor 84. To prevent the reference multiplexers from consuming power, both the drain and source of NMOS transistor 80 and NMOS transistor 84 connect to ground, while the drain and source of PMOS transistor 82 connect to $V_{cc}$. Accordingly, the reference y-select true signal is connected to one NMOS transistor 84 in each reference multiplexer 66 just as the data y-select true signal is connected to one NMOS transistor 78 in each column multiplexer circuit 68. Similarly, each reference y-select false signal is connected to one NMOS transistor 80 and one PMOS transistor 82 in each reference multiplexer 66, while each data y-select false signal is connected to one NMOS transistor 74 and one PMOS transistor 76 in each column multiplexer circuit 68.

It should be understood that the invention is not limited to the illustrated structures and that a number of substitutions can be made without departing from the scope and teachings of the present invention. For example, although the illustrated embodiment is a ROM, aspects of the invention could be applied in other types of memories as well.

In addition, the illustrated embodiment has memory cells comprised of NMOS transistors. Alternatively, the invention could be used in a ROM having memory cells comprised of PMOS transistors. In such an implementation, the waveforms on the bit lines and word lines would be reversed in polarity. Thus, for a self-timed precharge, a bit line would be precharged by causing the voltage on that line to move towards a low voltage. The end of precharge would be indicated by the voltage on the precharge reference bit line falling below a predetermined threshold voltage.

Similarly, in an implementation using PMOS transistors for the memory cells, the self-timed determination of when the value on the bit lines can be latched into the latches 42 would be made by determining when the voltage on read reference bit line 28 had risen beyond a predetermined threshold. Even where PMOS transistors are used as memory cells, the presetting of the bit lines 22 to a low voltage at the beginning of a memory cycle can still be referred to as "precharging" the bit lines. Similarly, the end of cycle discharge aspect of the invention can be accomplished by "discharging" the bit lines such that their voltage returns to $V_{cc}$ at the end of every memory cycle. Unused bit lines would also be held at $V_{cc}$ during the memory cycle. Where PMOS transistors are used then, the terms "precharge" and "discharge" may have seemingly counterintuitive meanings.

The embodiment illustrated in FIG. 1 has only a single read clock generated by read clock generator 34 as well as a single reference row 18. This configuration may be acceptable for small memories as a single row decoder may be used for each row. As the number of rows increases, so does the number inputs to the decoder for each row. At some point, a single decoder per memory row is not practical and a hierarchy of decoding is required.

One possible solution allows a group of rows to share a decoder. Each row in a group would have a separate read clock. Read clock generator 34 would generate a series of read clocks. Only one of the group of clock signals would be active during any particular memory cycle. To determine which clock to activate, read clock generator 34 would decode several address bits. In this type of an implementation, multiple reference rows 18 can be used, one for each read clock. For example, in a design with 1024 rows, eight address bits are used to select one of 256 groups. Two address bits are used to encode four read clocks to select one row out of the enabled group of four. In such an example, one would preferably use four reference rows, one of which would be enabled during a particular memory cycle.

Specific implementations have been disclosed for column multiplexer circuit 68, reference multiplexer 66 and precharge circuit 40. Other implementations could also be used. Similarly, one architecture has been disclosed for ROM 10. Other architectures could be used that take advantage of either the self-timing aspects or the reduced failures due to bit line coupling and power saving aspects of the present invention. Also, although the disclosed invention employs MOS technology, other technologies could also be used for ROM 10.

Although the present invention has been described in detail, it should be understood that various changes, substitutions, and alterations can be made hereto without departing from the spirit and scope of the invention as defined by the appended claims.

What is claimed is:

1. A method for reducing failures due to bit line coupling and reducing power consumption in a memory, wherein the memory comnprises a plurality of groups of bit lines, each group of bit lines multiplexed to a single output line, the method comprising:

precharging a first plurality of bit lines to a first voltage level, wherein the first plurality of bit lines consists of one bit line from each group of bit lines;

maintaining a second plurality of bit lines at a second voltage level, wherein the second plurality of bit lines consists of bit lines from each group of bit lines other than said one bit line of the first plurality of bit lines;

reading a data value from the memory;

discharging the first plurality of bit lines to the second voltage level after the data value has been read.

2. The method of claim 1 wherein the first voltage level corresponds to a logic high value and wherein the second voltage level corresponds to a logic low value.

3. The method of claim 1 wherein each group of bit lines is associated with a precharge circuit, each precharge circuit operable to precharge a bit line to the first voltage level.

4. The method of claim 3 wherein each of the first plurality of bit lines and each of the second plurality of bit lines is associated with a bit slice circuit, each bit slice circuit operable to maintain an associated bit line at the second voltage level when the associated bit line comprises one of the second plurality of bit lines, and to discharge the associated bit line to the second voltage level after the reading step when the associated bit line comprises one of the first plurality of bit lines.

5. The method of claim 4, wherein each bit slice circuit is further operable to connect its associated bit line to one of the precharge circuits when the associated bit line comprises one of the first plurality of bit lines.

6. The method of claim 1 wherein each of the first plurality of bit lines and each of the second plurality of bit lines is associated with a bit slice circuit, each bit slice circuit operable to maintain an associated bit line at the second voltage level when the associated bit line comprises one of the second plurality of bit lines, and to discharge the associated bit line to the second voltage level after the reading step when the associated bit line comprises one of the first plurality of bit lines.

7. The method of claim 1 wherein each bit line in the plurality of groups of bit lines is associated with a precharge circuit, each precharge circuit operable to precharge a bit line to the first voltage level.

8. The method of claim 7 wherein each precharge circuit is associated with a discharge circuit, each discharge circuit operable to maintain an associated bit line at the second voltage level when the associated bit line comprise one of the second plurality of bit lines, and to discharge the associated bit line to the second voltage level after the reading step when the associated bit line comprises one of the first plurality of bit lines.

9. The method of claim 8, wherein each discharge circuit is further operable to connect its associated bit line to its associated precharge circuit when the associated bit line comprises one of the first plurality of bit lines.

10. A memory, comprising:

a memory array comprising an n by m array of memory cells, where n represents the number of rows in the array and m represents the number of columns in the array, each memory cell in a column connected to a bit line wherein the m bit lines are divided into a plurality of groups of a first number of bit lines;

a plurality of bit slices, each bit slice comprising a first group of bit lines comprising one of the plurality of groups of a first number of bit lines;

a precharge circuit associated with each bit line in the first group of bit lines and operable to precharge a selected bit line in the first group to a first voltage level;

a plurality of column multiplexer circuits, one column multiplexer circuit per bit line in the first group, each column multiplexer circuit operable to connect its associated bit line to the precharge circuit when the associated bit line comprises a selected bit line.

11. The memory of claim 6 wherein each column multiplexer circuit is further operable to maintain its associated bit line at a second voltage level when that bit line does not comprise a selected bit line, and further operable to discharge its associated bit line to the second voltage level after a data value has been read from that bit line in a memory cycle where that bit line comprises a selected bit line.

12. The memory of claim 11 wherein the first voltage level corresponds to a logic high value and wherein the second voltage level corresponds to a logic low value.

13. The memory of claim 11, further comprising:

a first reference bit line;

a first reference precharge circuit operable to precharge the first reference bit line to a first reference voltage; and wherein each precharge circuit is connected to a selected bit line by one of the column multiplexers until the voltage on the first reference bit line falls within a first predetermined range.

14. The memory of claim 13, wherein the first reference bit line is connected to a different number of memory cells than a bit line in the memory array.

15. The memory of claim 13, wherein each column multiplexer circuit is further operable to maintain its associated bit line at a second voltage level when that bit line does not comprise a selected bit line, and further operable to discharge its associated bit line to the second voltage level after a data value has been read from that bit line in a memory cycle where that bit line comprises a selected bit line; and wherein the memory further comprises a control circuit connected to at least one column multiplexer circuit, the control circuit responsive to address signals received by the memory and operable to generate a first control signal to indicate to the at least one column multiplexer circuit whether its associated bit line is a selected bit line.

16. The memory of claim 10 further comprising:

a control circuit connected to at least one column multiplexer circuit, the control circuit responsive to address signals received by the memory and operable to generate a first control signal to indicate to the at least one column multiplexer circuit whether its associated bit line is a selected bit line.

17. The memory of claim 10, wherein the precharge circuit precharges the selected bit line in its associated bit line to a first voltage level in response to a second control signal.

18. The memory of claim 17, wherein each column multiplexer circuit is further operable to maintain its associated bit line at a second voltage level when that bit line does not comprise a selected bit line, and further operable to discharge its associated bit line to the second voltage level after a data value has been read from that bit line in a memory cycle where that bit line comprises a selected bit line; and wherein the memory further comprises a control circuit connected to at least one column multiplexer circuit, the control circuit responsive to address signals received by the memory and operable to generate a first control signal to indicate to the at least one column multiplexer circuit whether its associated bit line is a selected bit line.

19. A memory, comprising:

a memory array comprising an n by m array of memory cells, where n represents the number of rows in the array and m represents the number of columns in the array, each memory cell in a column connected to a bit line wherein the m bit lines are divided into a plurality of groups of a first number of bit lines;

a plurality of precharge circuits, each precharge circuit associated with a bit line in the first group of bit lines and operable to precharge its associated bit line to a first voltage level;

a plurality of discharge circuits each associated with a precharge circuit, each discharge circuit operable to maintain an associated bit line at a second voltage level when the associated bit line does not comprise a selected bit line, and to discharge its associated bit line to the second voltage level after a data value has been read from that bit line in a memory cycle where that bit line comprises a selected bit line.

20. The memory of claim 19, wherein each discharge circuit is further operable to connect its associated bit line to its associated precharge circuit when the associated bit line comprises a selected bit line.

21. The memory of claim 20, further comprising:

a first reference bit line;

a first reference precharge circuit operable to precharge the first reference bit line to a first reference voltage; and wherein each precharge circuit is connected to its associated bit line when that bit line is a selected bit line until the voltage on the first reference bit line falls within a first predetermined range.

22. The memory of claim 21, wherein the first reference bit line is connected to a different number of memory cells than a bit line in the memory array.

23. The memory of claim 22, further comprising:

a second reference bit line;

a second precharge circuit operable to precharge the second reference bit line to create a second reference voltage;

a discharge circuit coupled to the second reference bit line and operable to discharge the second reference bit line in response to a reference word line voltage applied to a reference word line;

a read control circuit operable to generate a capture data signal after the second reference voltage has discharged below a second threshold;

a plurality of multiplexers, each of the plurality of multiplexers having a plurality of inputs connected to ones of the bit lines; and a plurality of output latches, each output latch connected to the output of one of the plurality of multiplexers, wherein the topology and device size ratios for each of the plurality of output latches are nearly identical to the topology and device size ratios of the read control circuit.

* * * * *